US008308987B2

(12) United States Patent
McKiernan et al.

(10) Patent No.: US 8,308,987 B2
(45) Date of Patent: Nov. 13, 2012

(54) CONDUCTIVE POLYMER COMPOSITIONS IN OPTO-ELECTRICAL DEVICES

(75) Inventors: Mary J. McKiernan, Cottenham (GB); Jeremy Burroughes, Cambridge (GB); Annette Steudel, Cambridge (GB)

(73) Assignees: Cambridge Display Technology Limited, Cambridgeshire (GB); CDT Oxford Limited, Cambridgeshire (GB)

( * ) Notice: Subject to any disclaimer, the term of this patent is extended or adjusted under 35 U.S.C. 154(b) by 1061 days.

(21) Appl. No.: 11/995,576

(22) PCT Filed: Jul. 14, 2006

(86) PCT No.: PCT/GB2006/002643
§ 371 (c)(1),
(2), (4) Date: Jun. 16, 2008

(87) PCT Pub. No.: WO2007/007117
PCT Pub. Date: Jan. 18, 2007

(65) Prior Publication Data
US 2008/0265756 A1    Oct. 30, 2008

(30) Foreign Application Priority Data

Jul. 14, 2005   (GB) .................................. 0514476.1

(51) Int. Cl.
*H01B 1/00*      (2006.01)
*H01L 29/08*     (2006.01)
*H01J 1/62*      (2006.01)
*B05D 5/12*      (2006.01)

(52) U.S. Cl. .......... 252/500; 257/40; 428/690; 428/917; 313/504; 313/506; 427/66

(58) Field of Classification Search .................... 252/500
See application file for complete search history.

(56) References Cited

U.S. PATENT DOCUMENTS

| 4,539,507 | A  | 9/1985  | VanSlyke et al.    |
|-----------|----|---------|--------------------|
| 5,150,006 | A  | 9/1992  | Van Slyke et al.   |
| 5,432,014 | A  | 7/1995  | Sano et al.        |
| 5,621,131 | A  | 4/1997  | Kreuder et al.     |
| 6,083,634 | A  | 7/2000  | Shi                |
| 6,353,083 | B1 | 3/2002  | Inbasekaran et al. |
| 2002/0117662 | A1 | 8/2002 | Nii               |
| 2002/0182441 | A1 | 12/2002 | Lamansky et al.  |

(Continued)

FOREIGN PATENT DOCUMENTS
EP    0707020    4/1996
(Continued)

OTHER PUBLICATIONS

International Preliminary Report on Patentability for International Application No. PCT/GB2006/002643, dated Jan. 16, 2008.

(Continued)

*Primary Examiner* — Camie Thompson
(74) *Attorney, Agent, or Firm* — Marshall, Gerstein & Borun LLP

(57) ABSTRACT

A conductive composition for use in an organic light-emitting device comprising:
  a polycation having a conjugated backbone;
  a polyanion to balance the charge on the polycation; and
  a semiconductive hole transport polymer containing side groups pendant from the polymer backbone, each side group comprising one or more groups XY, where XY represents a group with a high dissociation constant such that it is ionized completely.

19 Claims, 1 Drawing Sheet

U.S. PATENT DOCUMENTS

| | | | |
|---|---|---|---|
| 2003/0010959 A1* | 1/2003 | Lee et al. | 252/500 |
| 2003/0054186 A1 | 3/2003 | Miyashita et al. | |
| 2005/0175861 A1 | 8/2005 | Elschner et al. | |
| 2009/0152531 A1* | 6/2009 | Towns et al. | 257/40 |

FOREIGN PATENT DOCUMENTS

| | | |
|---|---|---|
| EP | 0880303 | 11/1998 |
| EP | 0949850 A1 | 10/1999 |
| EP | 0842208 | 5/2000 |
| EP | 1245659 | 10/2002 |
| EP | 1564251 | 8/2005 |
| GB | 2348316 A | 9/2000 |
| JP | 2002-324679 | 11/2002 |
| WO | WO-90/13148 | 11/1990 |
| WO | WO-96/20253 | 7/1996 |
| WO | WO-98/10621 | 3/1998 |
| WO | WO-98/57381 | 12/1998 |
| WO | WO-00/48258 | 8/2000 |
| WO | WO-00/53656 | 9/2000 |
| WO | WO-00/55927 | 9/2000 |
| WO | WO-01/19142 A1 | 3/2001 |
| WO | WO-01/62869 | 8/2001 |
| WO | WO-01/81649 A1 | 11/2001 |
| WO | WO-02/31896 A2 | 4/2002 |
| WO | WO-02/31896 A3 | 4/2002 |
| WO | WO-02/44189 | 6/2002 |
| WO | WO-02/45466 | 6/2002 |
| WO | WO-02/066552 A1 | 8/2002 |
| WO | WO-02/068435 | 9/2002 |
| WO | WO-02/081448 | 10/2002 |
| WO | WO-02/084759 | 10/2002 |
| WO | WO-03/018653 | 3/2003 |
| WO | WO-03/022908 | 3/2003 |
| WO | WO-2004/029128 | 4/2004 |
| WO | WO-2004/029128 A3 | 4/2004 |

OTHER PUBLICATIONS

Written Opinion for International Application No. PCT//GB2006/002643, dated Oct. 18, 2006.

Ding et al., "Photovoltaic cells with a conjugated polyelectrolyte," Elsevier, 110:133-140 (2000).

Huang et al., "Novel Electroluminescent Conjugated Polyelectrolytes Based on Polyfluorene," Chem. Mater., 16:708-716 (2004).

Lukkari et al., "Polyelectrolyte Multilayers Pepared from Water-Soluble Poly (alkoxythiophene) Derivatives," J. Am. Chem. Soc., 123:6083-6091 (2001).

Combined Search and Examination Report for GB0514476.1 dated Dec. 15, 2005.

International Search Report for PCT/GB2006/002643 dated Oct. 18, 2006.

* cited by examiner

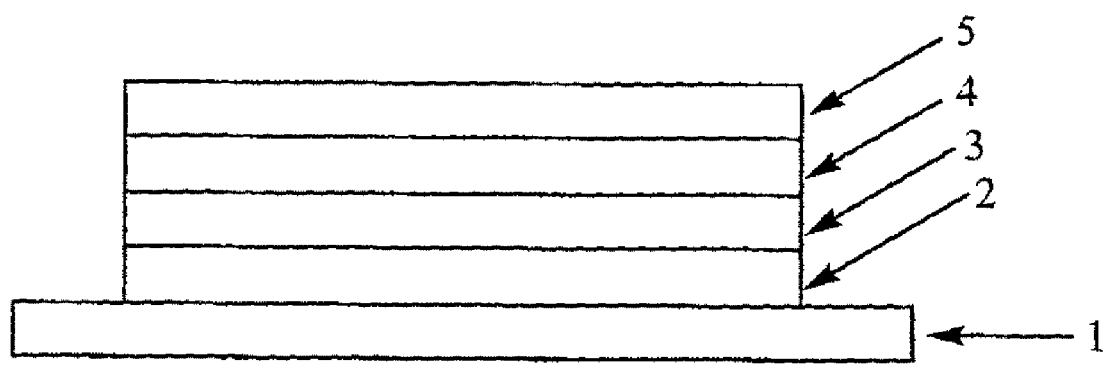

CONDUCTIVE POLYMER COMPOSITIONS IN OPTO-ELECTRICAL DEVICES

BACKGROUND OF THE INVENTION

1. Field of the Invention

This invention relates to conductive polymer compositions and opto-electrical devices comprising conductive polymer compositions.

2. Related Technology

One class of opto-electrical devices is that using an organic material for light emission or detection. The basic structure of these devices is a light emissive organic layer, for instance a film of a poly (p-phenylenevinylene) ("PPV") or polyfluorene, sandwiched between a cathode for injecting negative charge carriers (electrons) and an anode for injecting positive charge carriers (holes) into the organic layer. The electrons and holes combine in the organic layer generating photons. In WO90/13148 the organic light-emissive material is a polymer. In U.S. Pat. No. 4,539,507 the organic light-emissive material is of the class known as small molecule materials, such as (8-hydroxyquinoline) aluminium ("Alq3"). In a practical device one of the electrodes is transparent, to allow the photons to escape the device.

A typical organic light-emissive device ("OLED") is fabricated on a glass or plastic substrate coated with a transparent anode such as indium-tin-oxide ("ITO"). A layer of a thin film of at least one electroluminescent organic material covers the first electrode. Finally, a cathode covers the layer of electroluminescent organic material. The cathode is typically a metal or alloy and may comprise a single layer, such as aluminium, or a plurality of layers such as calcium and aluminium.

In operation, holes are injected into the device through the anode and electrons are injected into the device through the cathode. The holes and electrons combine in the organic electroluminescent layer to form an exciton which then undergoes radiative decay to give light.

These devices have great potential for displays. However, there are several significant problems. One is to make the device efficient, particularly as measured by its external power efficiency and its external quantum efficiency. Another is to optimise (e.g. to reduce) the voltage at which peak efficiency is obtained. Another is to stabilise the voltage characteristics of the device over time. Another is to increase the lifetime of the device.

To this end, numerous modifications have been made to the basic device structure described above in order to solve one or more of these problems. For example, a layer of a hole transport material may be provided between the anode and the light-emissive organic layer to assist transport of holes to the light-emissive organic layer. Also, a layer of an electron transport material may be provided between the cathode and the light-emissive organic layer to assist transport of electrons to the light-emissive organic layer.

Another such modification is the provision of a layer of conductive polymer between the light-emissive organic layer and one of the electrodes. It has been found that the provision of such a conductive polymer layer can improve the turn-on voltage, the brightness of the device at low voltage, the efficiency, the lifetime and the stability of the device.

Chem. Mater. 2004, 16, 708-716 discloses two conjugated fluorene polyelectrolytes (P2,P4), which are said to be suitable for use as electron injection layers.

One example of a suitable conductive polymer for use as a hole injection layer between the anode and the light-emissive organic layer is polystyrene sulfonic acid doped polyethylene dioxythiophene ("PEDOT-PSS")—see EP 0,686,662. This composition provides an intermediate ionisation potential (intermediate between the ionisation potential of the anode and that of the emitter) a little above 4.8 eV, which helps the holes injected from the anode to reach the HOMO level of a material, such as an organic light emissive material or hole transporting material, in an adjacent layer of an opto-electrical device. The PEDOT-PSS may also contain epoxy-silane to produce cross-linking so as to provide a more robust layer. Typically the thickness of the PEDOT/PSS layer in a device is around 50 nm. The conductance of the layer is dependent on the thickness of the layer.

The chemical structures for PEDOT and PSS are shown below:

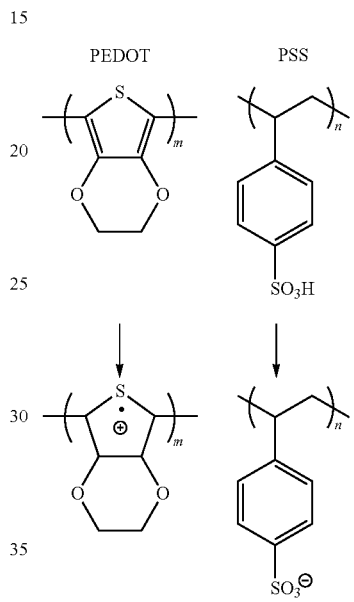

In a PEDOT-PSS composition the PEDOT is oxidized to produce a polymer radical cation which acts as a hole transporter. The oxidized dioxythiophene requires an anion to stabilise it; this is the PSS. The PSS ionises to produce a polymer anion which acts as a counter ion to stabilise the charge on the PEDOT.

PEDOT:PSS is water soluble and therefore solution processible. The provision of PEDOT:PSS between an ITO anode and an emissive layer (or a hole transport layer when present) increases hole injection from the ITO to the emissive layer, planarises the ITO anode surface, preventing local shorting currents and effectively makes energy difference for charge injection the same across the surface of the anode.

It has been found that varying the ratio of PEDOT:PSS in a layer of a device significantly changes the functional performance of the device.

A PEDOT:PSS ratio of 1:2.5 provides a stable processible solution. That is, materials with this ratio or higher PSS stay in solution. At low concentrations they come out of solution. However, at a ratio of 1:2.5 the conductivity is very high and as such this material cannot be used in some opto-electronic device arrangements as it can, for example, short connections between electrode lines in a device as discussed previously.

In practice, it has been found that using an excess of PSS (i.e. an amount in excess of the amount required to balance the charge on the PEDOT) can improve device performance and, in particular, can increase lifetime as disclosed in U.S. Pat. No. 6,605,823. Furthermore, excess PSS results in the composition being easier to ink jet print. By "excess PSS" is meant more PSS than is needed to prevent the PEDOT failing out of solution. Thus, using excess PSS, such as a PEDOT: PSS ratio of 1:6, 1:16 or even greater is useful in working devices.

It is evident from the above that it is advantageous to provide PSS in excess for ease of manufacture of a device and so as to produce a device with better performance and lifetime. However, there is always a desire to further improve the performance and lifetime of devices and make the manufacturing process easier and cheaper. Accordingly, alternatives to the PEDOT-PSS system having excess PSS are sought. Without being bound by theory, one possible limitation on the lifetime of devices using the aforementioned PEDOT-PSS system is that the provision of such a large excess of PSS results in a composition which is very acidic. This may cause several problems. For example, providing a high concentration of strong acid in contact with ITO may cause etching of the ITO with the release of indium, tin and oxygen components into the PEDOT which degrades the overlying light emitting polymer. Furthermore, the acid may interact with light emitting polymers resulting in charge separation which is detrimental to device performance.

Recently there have been studies of alternatives to PSS. For example, WO 04/029128 discloses the use of compositions comprising aqueous dispersions of polythiophenes and at least one colloid-forming polymeric acid as the buffer layer (hole injection layer) in an OLED. In particular a composition of PEDT/Nafion® (a fluorinated sulfonic acid) is disclosed.

Accordingly, there is a desire to provide an alternative to the aforementioned PEDOT-PSS system, preferably one which results in better device performance, lifetime and ease of manufacture.

GENERAL DESCRIPTION OF THE INVENTION

It is an aim of the present invention to solve one or more of the problems outlined above.

The first aspect of the present invention thus provides a conductive composition for use in an OLED comprising:
a polycation having a conjugated backbone;
a polyanion to balance the charge on the polycation; and
a semiconductive hole transport polymer containing side groups pendant from the polymer backbone, each side group comprising one or more groups XY, where XY represents a group with a high dissociation constant such that it is ionized completely.

The present composition has been found to be an attractive alternative to PEDOT/PSS as the hole injecting layer in an OLED. Since the present composition permits the use of less or no PSS, problems associated with a large excess of PSS largely may be obviated.

The composition will be water soluble. Solubility may be tuned by appropriate selection of the components and their concentrations in the composition. Advantageously, the present composition typically will not be soluble in non-polar solvents typically used for deposition of semiconductive organic materials. This means that the next layer of the device can be deposited from solution in such a non-polar organic solvent on the layer of the present composition without harming its integrity. This obviates the need to crosslink the layer after deposition and enables the layer to be thicker.

Advantageously, the hole transport polymer may be prepared having a higher molecular weight than currently used PSS. Owing to constraints on the method of preparation, currently used PSS has a molecular weight of about 70000 and may contain a low-Mw fraction which may diffuse into the emissive layer with detrimental effects on lifetime. Methods of preparing the hole transport polymer, such as Suzuki polymerisation as disclosed in, for example, WO 00/53656, allow the hole transport polymer to be prepared with a molecular weight in excess of 70000, preferably at least 100000.

The polycation preferably comprises an oxidized polymer such as a polythiophene. More preferably, the polycation comprises an oxidized conductive polythiophene derivative, such as an oxidized conductive poly (dioxythiophene). Most preferably, the polycation comprises oxidized conductive polyethylene dioxythiophene (PEDOT):

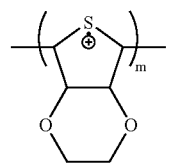

The hole transport polymer may be used effectively to replace at least some of the excess polyanion (typically PSS) in previously known hole-injection compositions, in particular to tune the conductivity of the composition. Some or all of the excess polyanion in previously known hole-injection compositions may be replaced. The ratio of polycation: hole transport polymer can be varied as desired for the particular application. When the hole transport polymer replaces all of the excess polyanion in previously known compositions using polystyrene sulfonic acid, the composition substantially will not contain any polystyrene sulfonic acid that is not in the ionized form ("non-ionized polystyrene sulfonic acid").

The polyanion may comprise the ionized form of the hole transport polymer. When the polyanion is the ionized form of the hole transport polymer, the composition will not need to contain any polyanion other than the ionized form of the hole transport polymer.

When the hole transport polymer replaces all of the polyanion and the non-ionized excess thereof in previously known compositions, the present hole transport polymer stabilises the polycation to prevent the polycation from coming out of solution and also tunes conductivity.

Alternatively, the polyanion may comprise the ionized form of another polymer such as PSS or one of the polymers disclosed in WO 04/029128.

It will be understood that the polycation, polyanion and hole transport polymer are physically mixed in the composition.

The hole transport polymer may comprise regions, each region having a HOMO energy level and a LUMO energy level that are distinct from the HOMO and LUMO energy level of the other regions. In view of the distinct HOMO and LUMO energy levels, each region is functionally distinct.

The hole transport polymer may contain one or more hole transport regions. The hole transport polymer or a hole transport region in the hole transport polymer preferably has a HOMO energy level of at least 4.8 eV, more preferably in the range 4.8 to 6 eV, still more preferably in the range 4.8 to 5.5 eV.

The hole transport polymer preferably comprises an aryl or heteroaryl repeat group (Ar). The aryl or heteroaryl repeat groups may be present in the polymer backbone. The aryl or heteroaryl repeat groups may be present in side groups pendant from the polymer backbone.

When Ar is present in a side group that is pendant from the polymer backbone, the side group may be attached to a non-conjugated or conjugated region in the polymer backbone.

The backbone of the hole transport polymer may have regions of conjugation. The regions of conjugation may be broken by regions of non-conjugation. The backbone may be fully conjugated or fully non-conjugated. A conjugated region consists of one or more conjugated groups in the backbone. A non-conjugated region consists of one or more non-conjugated groups in the backbone.

The hole transport polymer contains side groups comprising one or more groups XY, where XY represents a group with a high dissociation constant such that it effectively is ionized completely. Typically, group XY enhances the water solubility of the composition.

XY may be pendant from a non-conjugated region of the polymer backbone.

XY may be pendant from a conjugated region of the polymer backbone.

XY represents a group with a high dissociation constant, such that the group effectively is ionized completely. Preferably the dissociation constant Ka is greater than $10^{-12}$. XY may represent a strong acid or a salt.

XY may represent $SO_3Y$. Counterion Y may be H (i.e. sulfonic acid), or a metal cation, in particular K or Na.

XY may represent a carboxylic acid or an acrylic acid.

XY may represent a quaternized salt; for example having formula

where X represents an anion such as a halide, preferably Br or tetrafluorborate $BF_4^-$ or hexafluorophosphate $PF_6^-$. $R^2$, $R^3$ and $R^4$ independently represent alkyl, preferably C1 to C10 alkyl, more preferably methyl.

A preferred quaternized salt is

An advantage of hole transport polymers when XY represents a salt, particularly a sulphonate salt or a quaternized salt, is that the hole transport polymer is less acidic than PSS. As described above it is believed that the acidity of PSS is responsible for various degradation mechanisms in an OLED.

The Ar repeat groups in the polymer advantageously can be functional repeat groups in the polymer. In other words, the Ar repeat groups may give rise to the hole transporting properties of the polymer. This affords the present polymer further advantages over PSS, which has no charge transporting properties. When the Ar repeat groups are present in the polymer backbone they may give rise to hole transporting properties along the backbone.

Ar may represent any suitable aryl or heteroaryl group. Ar may represent an optionally substituted hydrocarbyl aryl group, in particular fluorene (particularly 2,7-linked fluorene), spirofluorene, indenofluorene, phenylene, or phenylenevinylene. Ar may represent an optionally substituted heteroaryl group, in particular thiophene or benzothiadiazole. Ar may represent an optionally substituted (e.g. alkylated) triarylamine group, in particular triphenylamine. Ar may represent an optionally substituted carbazole group. Ar may be selected according to desired charge transport and/or emissive properties for the hole transport polymer.

Ar may be substituted. Examples of substituents include solubilising groups; electron withdrawing groups such as fluorine, nitro or cyano; and substituents for increasing glass transition temperature (Tg) of the polymer.

In order to confer hole transporting properties on the polymer, it is preferred that Ar comprises an optionally substituted triarylamine or an optionally substituted carbazole.

In one embodiment, the hole transport polymer contains a repeat side group comprising formula 1:

where Ar represents an aryl or heteraryl group and XY represents a group with a high dissociation constant, such that it effectively is ionized completely ($X^\ominus Y^\oplus$):

In the case of formula 2, the polymer is present as a polyanion with an associated cation. The associated cation may be capable of oxidising a precursor polymer to it's polycation. Thus, when the hole transport polymer is present in the composition with a precursor polymer to the polycation, the polyanion and polycation are formed. Thus, the hole transport polymer may be used to replace not just the excess but all of the PSS in previously known hole injection compositions. When the present hole transport polymer replaces all of the polyanion and the non-ionized excess thereof in previously known compositions, the present hole transport polymer stabilises the polycation to prevent the polycation from coming out of solution and also tunes conductivity.

Ar may represent phenyl or biphenyl. The repeat side group may comprise formula 4 or 5:

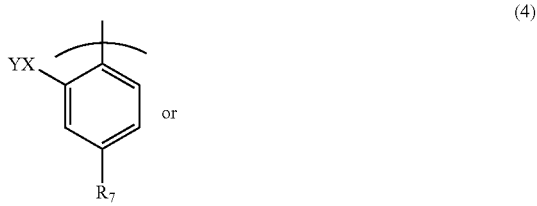

(5)

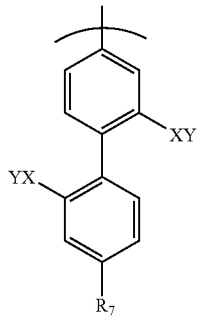

where R₇ represents H or a substituent group. Examples of substituents include solubilising groups such as $C_{1-20}$ alkyl or alkoxy; electron withdrawing groups such as fluorine, nitro or cyano; and substituents for increasing glass transition temperature (Tg) of the polymer.

Ar may represent triphenylamine. The repeat side group may comprise formula 6:

(6)

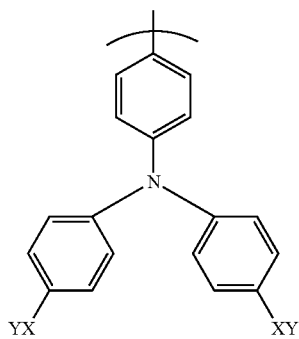

In one embodiment, the repeat side group is pendant from a non-conjugated group in the backbone. For example, the hole transport polymer may comprise a repeat unit of formula 7:

(7)

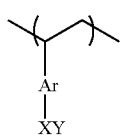

where the side group Ar—XY is as defined anywhere above, for example as shown in formula 8 or formula 9:

(8)

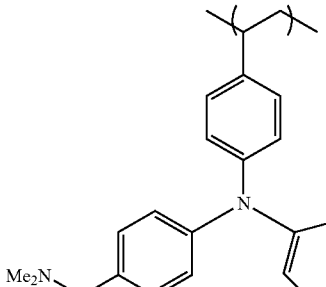

or (9)

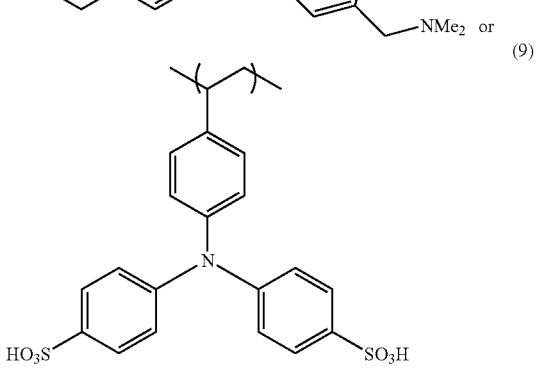

The hole transport polymer may comprise a copolymer comprising a first repeat unit as shown in any one of formulae 7 to 9 and a second repeat. The second repeat unit may have formula 10 or 11:

(10)

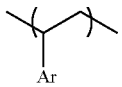

where Ar is as defined anywhere herein.

(11)

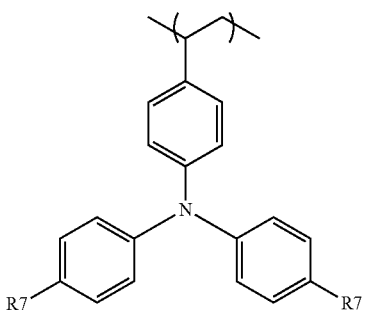

where R₇ represents H or a substituent group. Examples of substituents include solubilising groups such as $C_{1-20}$ alkyl or alkoxy; electron withdrawing groups such as fluorine, nitro or cyano; and substituents for increasing glass transition temperature (Tg) of the polymer.

Polymers with a part or the whole of the backbone being non-conjugated may be formed by polymerising the repeat units, which form non-conjugated segments of the backbone, through an unsaturated group attached to the repeat unit, for example an acrylate group or a vinyl group. The unsaturated group may be separated from the functional repeat unit by a spacer group. Polymers of this type are disclosed in, for example, WO 96/20253.

In one embodiment, the hole transport polymer comprises a repeat unit comprising general formula 12:

(12)

where Ar represents an aryl or heteroaryl group; $R^1$ represents an optional organic linking group and XY represents a group with a high dissociation constant, such that it effectively is ionized completely ($X^{\ominus}Y^{\oplus}$):

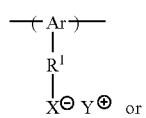
(13)

or

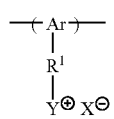
(14)

In the case of formula 13, the polymer is present as a polyanion with an associated cation. The associated cation may be capable of oxidising a precursor polymer to it's polycation. Thus, when the hole transport polymer is present in the composition with a precursor polymer to the polycation, the polyanion and polycation are formed. Thus, the hole transport polymer may be used to replace not just the excess but all of the PSS in previously known hole injection compositions. When the present hole transport polymer replaces all of the polyanion and the non-ionized excess thereof in previously known compositions, the present hole transport polymer stabilises the polycation to prevent the polycation from coming out of solution and also tunes conductivity.

In this embodiment the side groups comprising XY will be pendant from a conjugated region of the polymer backbone.

$R^1$ may comprise a group which breaks the conjugation between XY and Ar.

$R^1$ may be substituted with more than one XY group, for example two XY groups.

Preferred linking groups include aryl and heteroaryl groups such as phenyl; alkyl groups, for example $(CH_2)_n$ where n is from 2 to 10, preferably 2 to 4; alkoxy groups, for example $O(CH_2)_{n'}$ where n' is from 2 to 10, preferably 4; perfluoroalkyl groups, for example $(CF_2)_{n^2}$ where $n^2$ is from 2 to 10; and perfluoroalkoxy groups, for example $O(CF_2)_{n^3}$ where $n^3$ is from 2 to 10.

Ar in formulae 12 to 14 may represent an aryl or heteroaryl group defined anywhere herein.

Ar may represent biphenyl. A repeat unit comprising formula 12 may comprise formula 15:

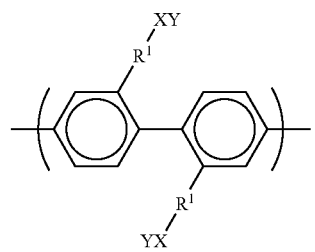
(15)

where $R^1$ and XY are as defined anywhere herein.
Preferably there is no linking group $R^1$, giving formula 16 or 17:

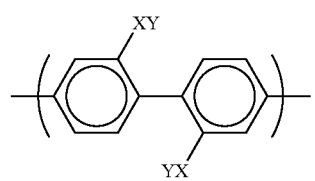
(16)

where XY is as defined anywhere herein.

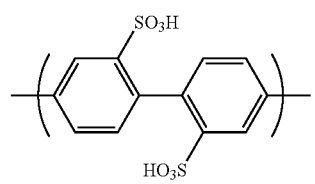
(17)

Ar may represent fluorene. A repeat unit comprising formula 12 may comprise formula 18 or 19:

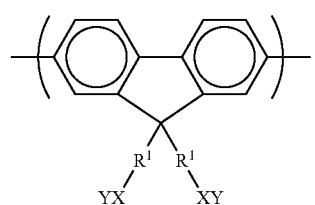
(18)

where $R^1$ and XY are as defined anywhere herein.

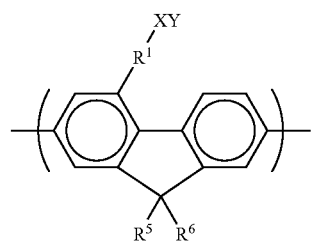
(19)

where $R^1$ and XY are as defined anywhere herein and $R^5$ and $R^6$ represent H or a substituent group. Examples of substituents include solubilising groups such as $C_{1-20}$ alkyl or alkoxy; electron withdrawing groups such as fluorine, nitro or cyano; and substituents for increasing glass transition temperature (Tg) of the polymer.

Preferably the $R^1$ linking groups are present in formulae 18 and 19.

A repeat unit having formula 12 may comprise one of formulae 20 to 26:

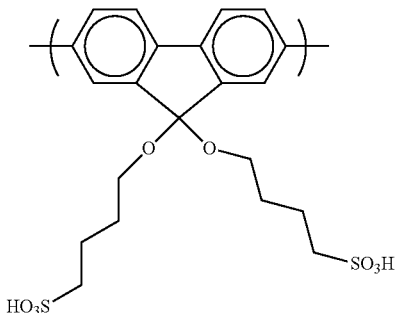
(20)

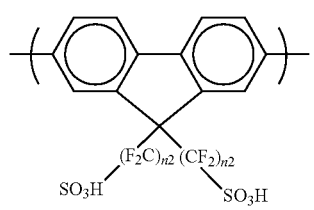
(21)

where $n^2$ is as defined above.

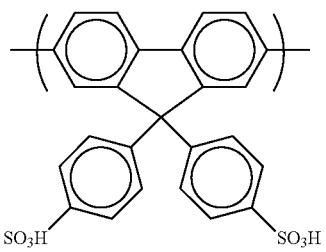
(22)

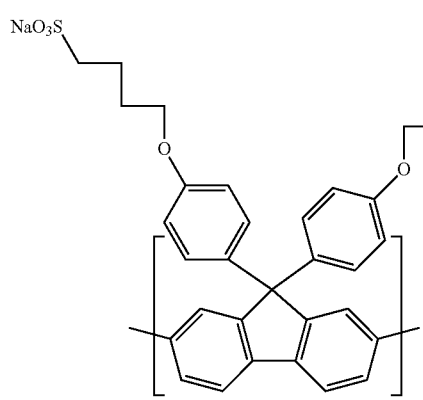
(23)

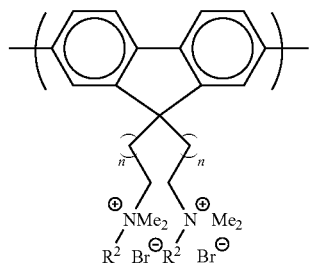
(24)

where n is as defined above.

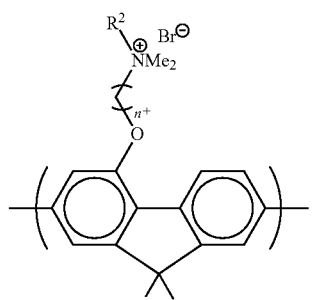
(25)

where n' is as defined above.

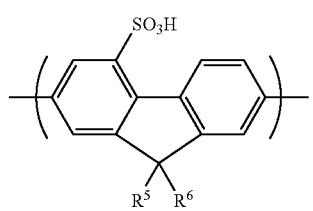
(26)

where $R^5$ and $R^6$ are as defined above

Ar may represent phenyl. A repeat unit comprising formula 12 may comprise formula 27:

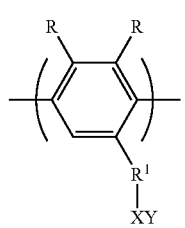
(27)

where $R^1$ and XY are as defined anywhere herein and R represents H or a substituent group. Examples of substituents include solubilising groups such as $C_{1-20}$ alkyl or alkoxy; electron withdrawing groups such as fluorine, nitro or cyano; and substituents for increasing glass transition temperature (Tg) of the polymer.

For example, a repeat unit comprising formula 12 may comprise formula 28:

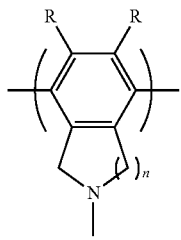
(28)

where R is as defined in relation to formula 27 and n is as defined above.

A repeat unit comprising formula 12 may comprise formula 29:

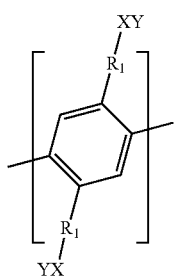
(29)

where $R^1$ and XY are as defined anywhere herein.

For example, a repeat unit comprising formula 12 may comprise formula 30:

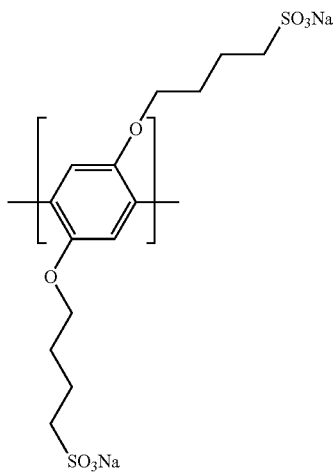
(30)

Ar may represent triphenylamine. A repeat unit comprising formula 12 may comprise formula 31:

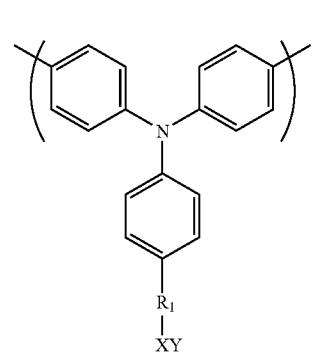
(31)

where $R^1$ and XY are as defined anywhere herein.

For example, a repeat unit comprising formula 12 may comprise formula 32, 33 or 34:

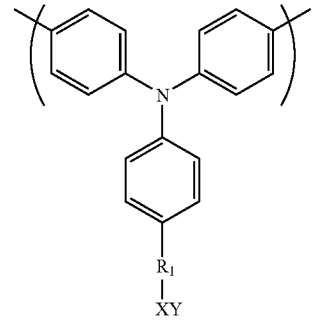
(32)

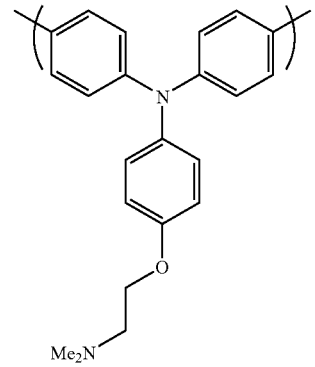
(33)

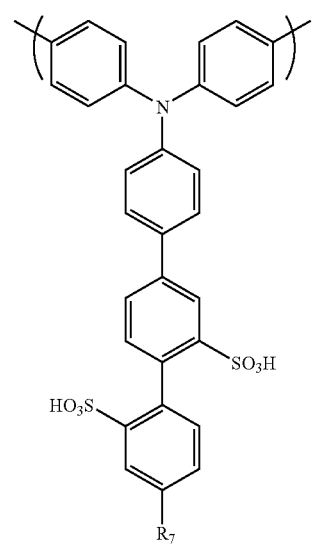

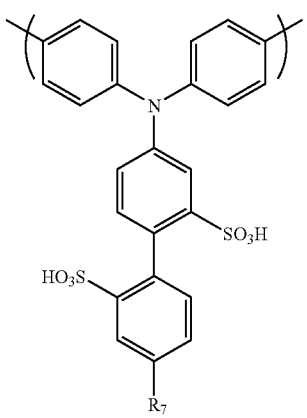

(34)

where $R_7$ represents H or a substituent group. Examples of substituents include solubilising groups such as $C_{1-20}$ alkyl or alkoxy; electron withdrawing groups such as fluorine, nitro or cyano; and substituents for increasing glass transition temperature (Tg) of the polymer.

$R^1$ in formula 31 may represent phenyl or biphenyl.

In addition to the repeat unit of formula 12, the polymer may contain one or more further aryl or heteroaryl repeat unit. This further repeat unit may be selected to tune the charge transporting and/or emissive properties further. For example, the polymer may comprise a triarylamine repeat unit to aid hole transport.

The triarylamine repeat unit may be selected from formulae 35 to 40:

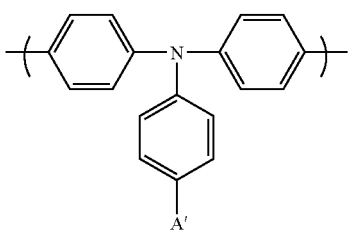

35

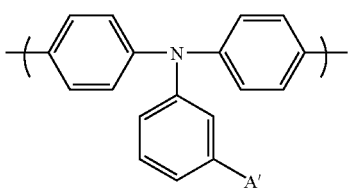

36

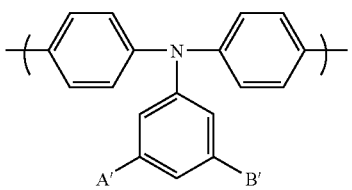

37

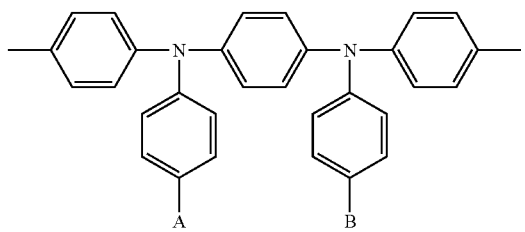

38

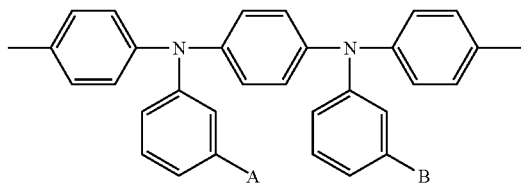

39

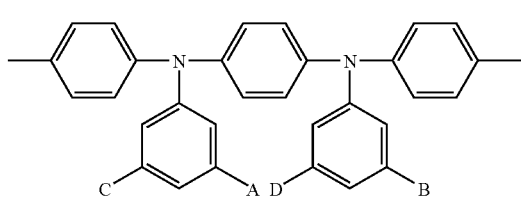

40 wherein A', B', A, B, C and D are independently selected from H or a substituent group. More preferably, one or more of A', B', A, B, C and D is independently selected from the group consisting of optionally substituted, branched or linear alkyl, aryl, perfluoroalkyl, thioalkyl, cyano, alkoxy, heteroaryl, alkylaryl and arylalkyl groups. Most preferably, A', B', A and B are $C_{1-10}$ alkyl.

One or more phenyl groups of repeat units 35-40 may optionally be linked. These phenyl groups may be linked by a direct bond or by a divalent linking group comprising one or more atom. For example, the linking group may comprise an oxygen or sulfur atom.

Desirably a hole transporting polymer may comprise a triarylamine repeat unit and a fluorene repeat unit. The polymer may be an AB copolymer.

The present composition may effectively combine the functions of the hole-injecting layer and the hole transporting layer in previously known devices, thereby simplifying the device architecture. This is a particular advantage since problems are encountered during manufacture of OLEDs by deposition of multiple organic layers from organic solvents. Specifically, the integrity of an organic layer may be lost or damaged by solution deposition of a further organic layer over it.

The hole transport polymer as defined anywhere above may comprise a fluorene repeat unit comprising formula 41:

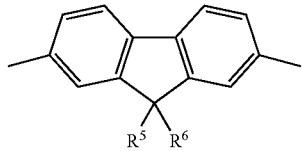

41 wherein $R^5$ and $R^6$ are independently selected from hydrogen or optionally substituted alkyl, alkoxy, aryl, arylalkyl, heteroaryl and heteroarylalkyl. More preferably, at least one of $R^5$ and $R^6$ comprises an optionally substituted $C_4$-$C_{20}$ alkyl or aryl group. Most preferably, $R^5$ and $R^6$ represent n-octyl.

The hole transport polymer may comprise a triarylamine repeat unit; a first fluorene repeat unit of one of formulae 18 to 26; and optionally a second fluorene repeat unit as defined anywhere herein. A preferred ratio of triarylamine repeat unit: first fluorene repeat unit: second fluorene repeat unit is 50:30: 20.

The hole transport polymer may comprise a triarylamine repeat unit and a biphenyl repeat unit of one of formulae 15 to 17.

The hole transport polymer may comprise fluorene repeat unit and a phenyl repeat unit of one of formulae 27 to 30.

The hole transport polymer may comprise a linear polymer. Preferably at least 5 mol % of the repeat units in the linear polymer are conjugated along the polymer backbone.

The hole transport polymer may have formula 42:

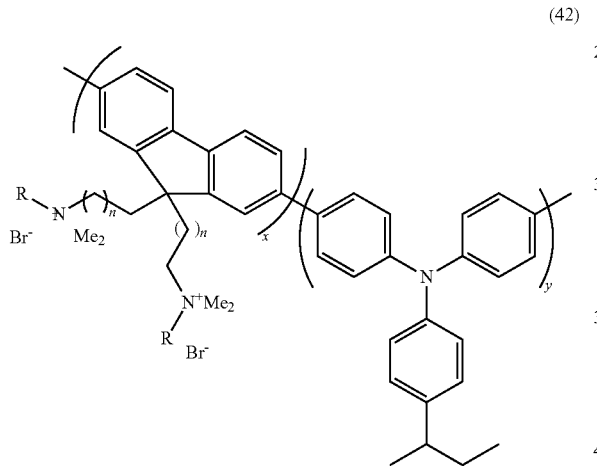

The hole transport polymer of formula 42 is derivable from a polymer having formula 43:

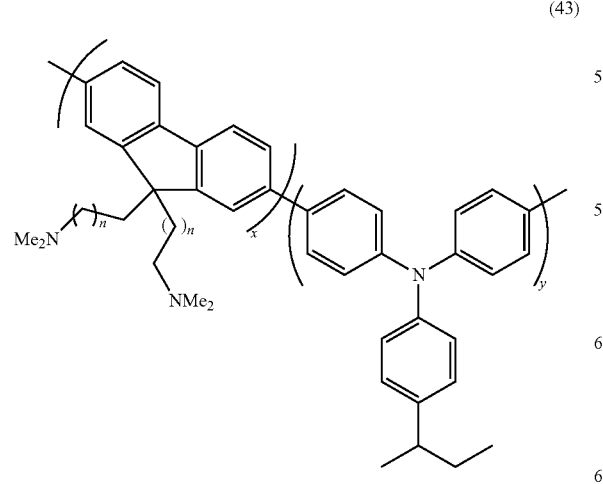

The polymer having formula 43 may be prepared by copolymerising monomer (1):

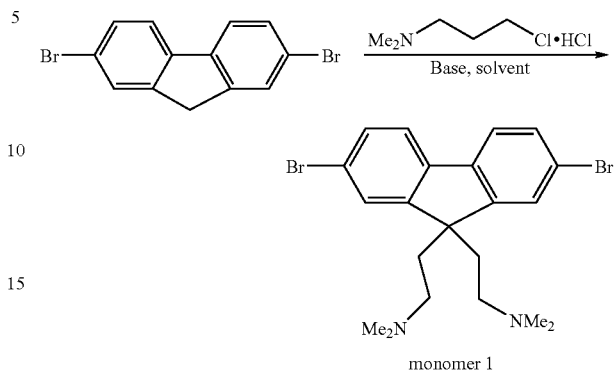

The hole transport polymer may have formula 44:

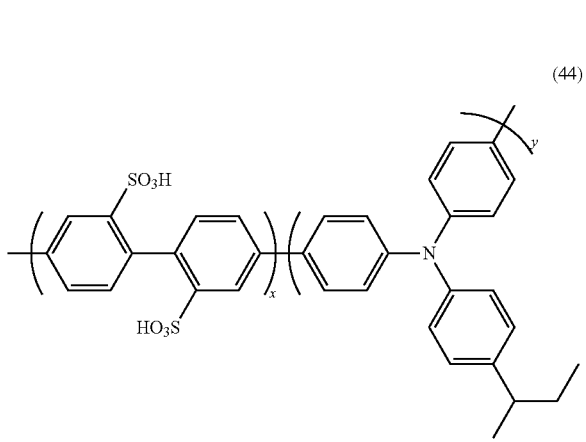

The hole transport polymer having formula 44 may be prepared by copolymerising monomer (2):

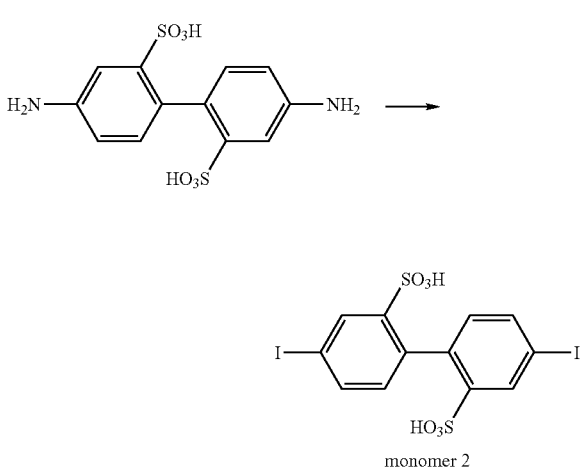

The hole transport polymer may have formula 45:

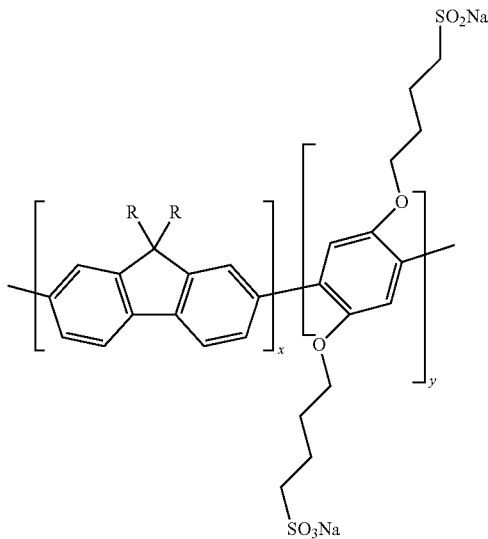

(45)

The sulphonate containing monomer can be made according to the method in Macromolecules 1998, 31, 964-974, with appropriate modifications for the O(CH$_2$)$_4$SO$_3$Na side groups in place of O(CH$_2$)$_3$SO$_3$Na.

The present hole transport polymer may comprise a dendrimer. A dendrimer is a tree-like polymer, which comprises dendron(s) emanating from a central core. Usually there are at least three dendrons. A dendron comprises a branched unit. The branched unit may be a repeat unit in the dendron. Each dendron comprises a backbone. Side groups may be pendant from the backbone.

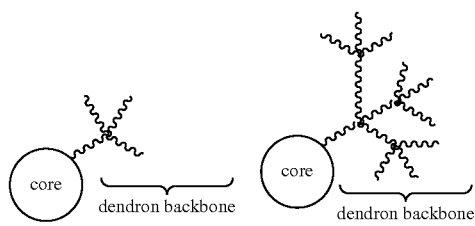

The core of the dendrimer may comprise formula 46 or 47:

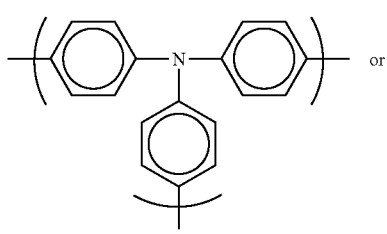

or

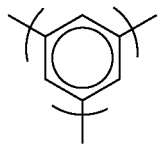

(47)

Each dendron may comprise a triarylamine repeat unit. Each dendron may comprise a triarylamine repeat unit and a fluorene repeat unit. Each dendron may comprise a thiophene repeat unit, optionally together with a triarylamine and/or fluorene repeat unit.

Further materials, particularly polymers, may be present in the composition. For example, a further hole transport, electron transport and/or emissive material may be blended into the composition.

The compositions of the present invention may be prepared by physical or chemical processes.

With regard to a physical process: a composition of the present invention may be prepared by physically blending the semiconductive hole transport polymer with the polycation/balancing polyanion. For example, some or all of the excess PSS that is added to PEDOT:PSS, as described in the aforementioned prior art, above may be replaced with the semiconductive hole transport polymer. For instance, the semiconductive hole transport polymer may be blended with the PEDOT:PSS formulation sold as Baytron P® by H C Starck of Leverkusen, Germany.

With regard to a chemical process: the polycation may be prepared by polymerisation of the corresponding monomer in the presence of the semiconductive hole transport polymer. For example, synthesis of PEDOT:PSS is described in S. Kirchmeyer & K Reuter, J. Mater. Chem. 2005 (15), 2077-2088, and documents referenced therein, by oxidative polymerisation of ethylenedioxythiophene in the presence of PSS. An exemplary composition according to the present invention may be prepared by an analogous process in which ethylenedioxythiophene is polymerised in the presence of the semiconductive hole transport polymer. According to this chemical process, a conductive composition is provided that contains neither charge-balancing polyanionic PSS nor excess PSS (although excess PSS may be added if desirable).

It is envisaged that compositions of the present invention may be used in an electrical device, particularly an optoelectronic device such an OLED. It is envisaged that the compositions of the present invention may be used as a hole injecting and optionally hole transporting and/or emissive material, typically in a layer next to the anode such as a hole-injecting layer or light-emissive layer.

According to a second aspect of the present invention there is provided a polymer having a structure as described in relation to the hole transport polymer in the first embodiment of the present invention.

A third aspect of the present invention provides an OLED comprising:
an anode;
a cathode;
a light-emitting layer located between the anode and the cathode; and
a hole-injecting layer located between the anode and the light-emitting layer,
characterised in that the hole-injecting layer comprises a composition according to the first aspect of the present invention.

According to a fourth aspect of the present invention there is provided a method of manufacturing a polymer as described in relation to the second aspect of the present invention. The hole transport polymer may first be prepared in precursor form.

Preferred methods for preparation of these polymers are Suzuki polymerisation as described in, for example, WO 00/53656 and Yamamoto polymerisation as described in, for example, T. Yamamoto, "Electrically Conducting And Thermally Stable n—Conjugated Poly(arylene)s Prepared by Organometallic Processes", Progress in Polymer Science 1993, 17, 1153-1205. These polymerisation techniques both operate via a "metal insertion" wherein the metal atom of a metal complex catalyst is inserted between an aryl group and a leaving group of a monomer. In the case of Yamamoto polymerisation, a nickel complex catalyst is used; in the case of Suzuki polymerisation, a palladium complex catalyst is used.

For example, in the synthesis of a linear polymer by Yamamoto polymerisation, a monomer having two reactive halogen groups is used. Similarly, according to the method of Suzuki polymerisation, at least one reactive group is a boron derivative group such as a boronic acid or boronic ester and the other reactive group is a halogen. Preferred halogens are chlorine, bromine and iodine, most preferably bromine.

It will therefore be appreciated that repeat units and end groups comprising aryl groups as illustrated throughout this application may be derived from a monomer carrying a suitable leaving group(s).

Suzuki polymerisation may be used to prepare regioregular, block and random copolymers. In particular, homopolymers or random copolymers may be prepared when one reactive group is a halogen and the other reactive group is a boron derivative group. Alternatively, block or regioregular, in particular AB, copolymers may be prepared when both reactive groups of a first monomer are boron and both reactive groups of a second monomer are halogen.

As alternatives to halides, other leaving groups capable of participating in metal insertion include tosylate, mesylate, phenyl sulfonate and triflate.

Monomers for preparing a polymer according to the method of the second aspect may comprise formula 48 or 49:

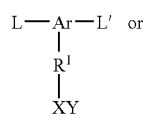

(48)

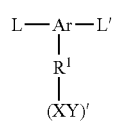

(49)

where Ar, $R^1$, X and Y are as defined anywhere above; L and L' are reactive groups suitable for participating in a polymerisation reaction; and (XY)' represents a precursor to XY, which may be converted to XY after polymerisation.

L and L' may represent Br.

Preferred monomers include those comprising the structure shown in one of formulae 50 to 68:

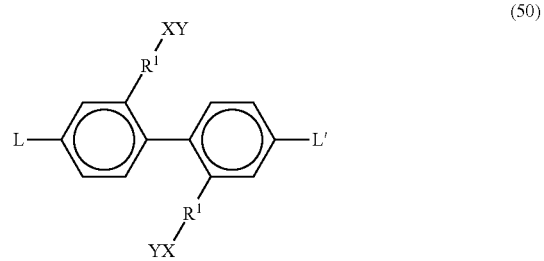

(50)

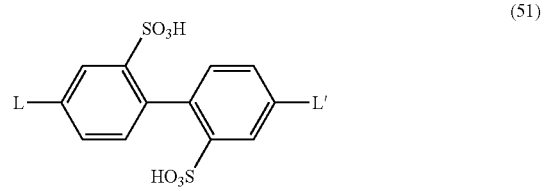

(51)

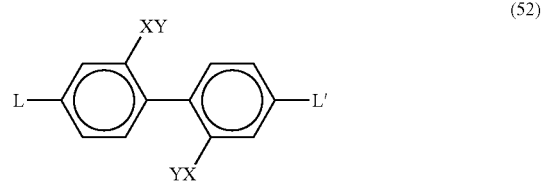

(52)

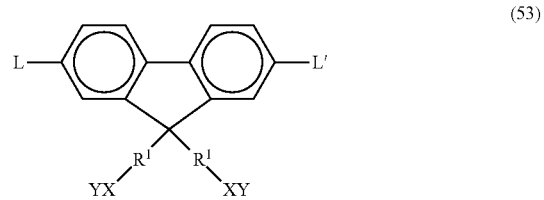

(53)

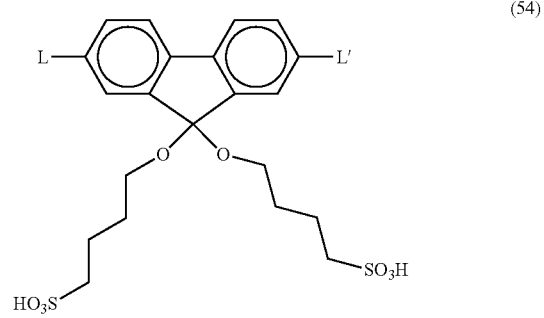

(54)

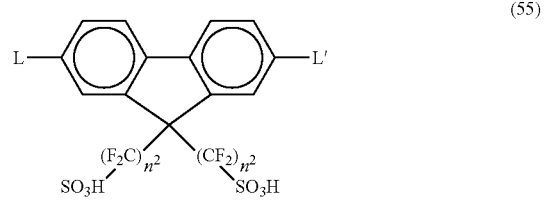

(55)

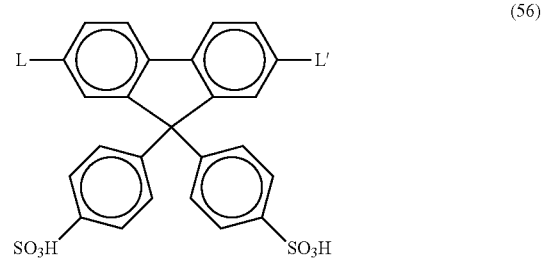

(56)

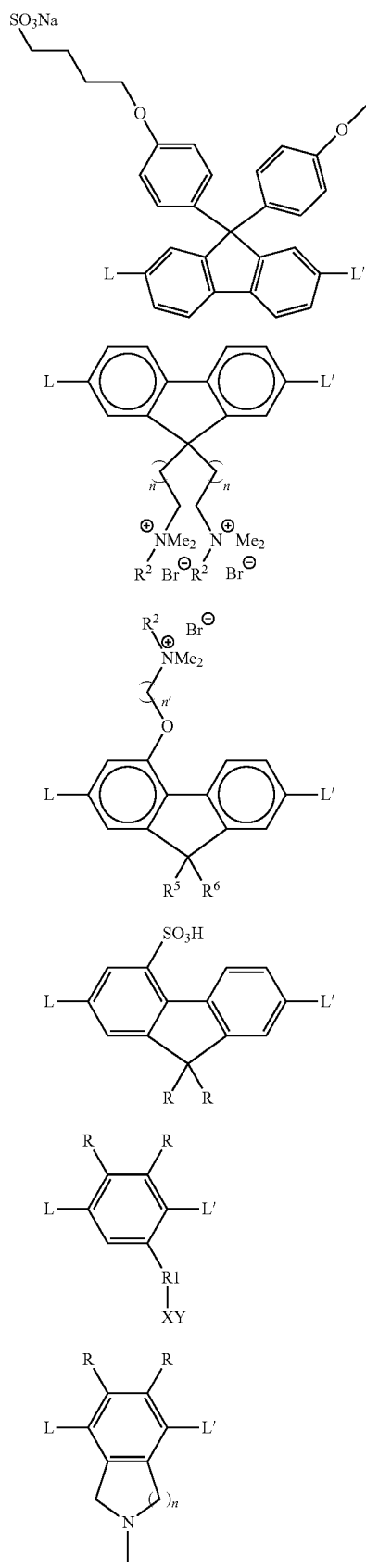
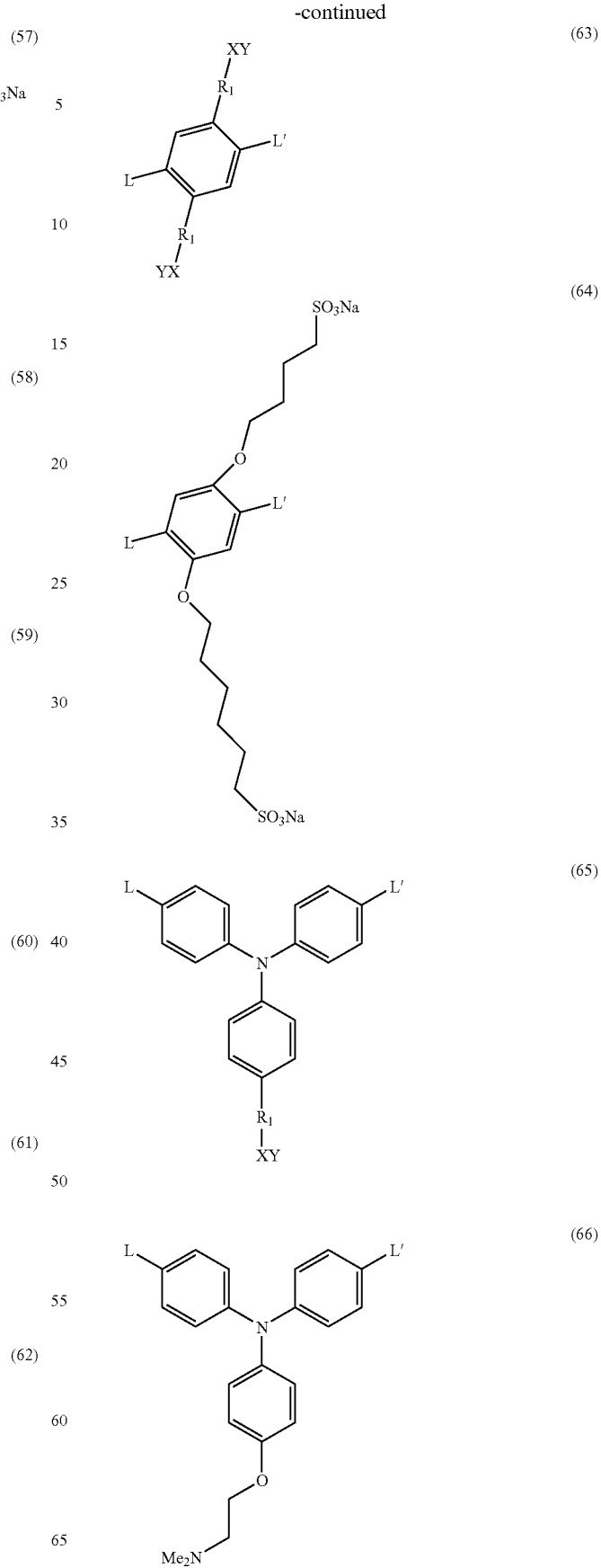

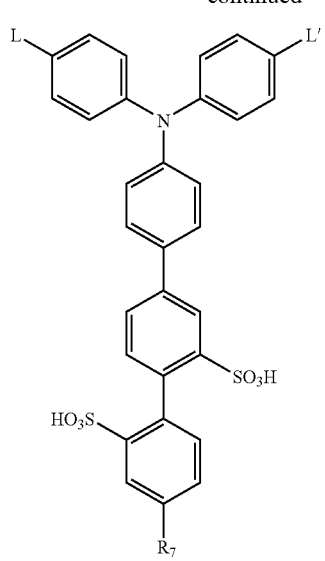

(67)

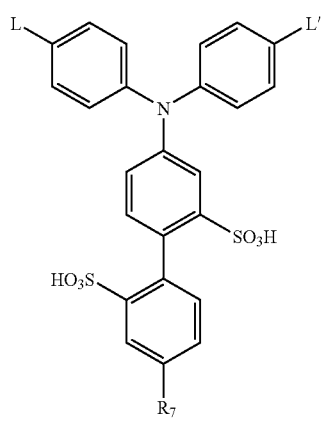

(68)

Polymers with a part or the whole of the backbone being non-conjugated may be formed by polymerising the repeat units, which form non-conjugated segments of the backbone, through an unsaturated group attached to the repeat unit, for example an acrylate group or a vinyl group. The unsaturated group may be separated from the functional repeat unit by a spacer group. Polymers of this type are disclosed in, for example, WO 96/20253.

According to a fifth aspect of the present invention there is provided a method of manufacturing an electrical device such as an OLED, for example as described herein, wherein the present composition is deposited by spin coating or ink jet printing or roll printing. The present composition may be deposited in an aqueous solution or any other suitable solvent.

In making an OLED as defined in relation to the third aspect, the method according to the fifth aspect preferably includes the steps of:

(a) forming the hole-injecting layer by depositing a solution comprising a composition as defined in relation to the first aspect in a first solvent; and (b) forming the light-emitting layer on the hole-injecting layer by depositing a solution comprising a light-emitting material in a second solvent.

Advantageously in view of the different solubility properties of a composition as defined in relation to the first aspect and a typical light-emitting material, the composition according to the first aspect substantially is not soluble in the second solvent. The first solvent may be water. The second solvent may be a common organic solvent.

BRIEF DESCRIPTION OF THE DRAWING

Embodiments of the present invention will now be described by way of example only with reference to the accompanying drawing in which:

FIG. 1 shows an organic light emitting device according to an embodiment of the present invention.

DETAILED DESCRIPTION

The device shown in FIG. 1 comprises a transparent glass or plastic substrate 1, an anode 2 of indium tin oxide and a cathode 5. An electroluminescent layer 4 is provided between anode 2 and cathode 5. In accordance with an embodiment of the present invention, a hole injecting layer 3 of the composition according to the present invention is provided between anode 2 and electroluminescent layer 4.

Further layers may be located between anode 2 and cathode 3, such as charge transporting, electron injecting or charge blocking layers.

The hole injecting layer 3 located between anode 2 and electroluminescent layer 3 preferably has a HOMO level of less than or equal to 5.5 eV, more preferably around 4.8-5.5 eV.

If present, an electron transporting layer located between electroluminescent layer 4 and cathode 5 preferably has a LUMO level of around 3-3.5 eV.

Electroluminescent layer 4 may consist of the electroluminescent material alone or may comprise the electroluminescent material in combination with one or more further materials. In particular, the electroluminescent material may be blended with hole and/or electron transporting materials as disclosed in, for example, WO 99/48160. Alternatively, the electroluminescent material may be covalently bound to a charge transporting material.

Cathode 5 is selected from materials that have a workfunction allowing injection of electrons into the electroluminescent layer. Other factors influence the selection of the cathode such as the possibility of adverse interactions between the cathode and the electroluminescent material. The cathode may consist of a single material such as a layer of aluminium. Alternatively, it may comprise a plurality of metals, for example a bilayer of calcium and aluminium as disclosed in WO 98/10621, elemental barium disclosed in WO 98/57381, Appl. Phys. Lett. 2002, 81(4), 634 and WO 02/84759 or a thin layer of dielectric material to assist electron injection, for example lithium fluoride disclosed in WO 00/48258 or barium fluoride, disclosed in Appl. Phys. Lett. 2001, 79(5), 2001. In order to provide efficient injection of electrons into the device, the cathode preferably has a workfunction of less than 3.5 eV, more preferably less than 3.2 eV, most preferably less than 3 eV.

Optical devices tend to be sensitive to moisture and oxygen. Accordingly, the substrate preferably has good barrier properties for prevention of ingress of moisture and oxygen into the device. The substrate is commonly glass, however alternative substrates may be used, in particular where flexibility of the device is desirable. For example, the substrate may comprise a plastic as in U.S. Pat. No. 6,268,695 which discloses a substrate of alternating plastic and barrier layers or a laminate of thin glass and plastic as disclosed in EP 0949850.

The device is preferably encapsulated with an encapsulant (not shown) to preventingress of moisture and oxygen. Suitable encapsulants include a sheet of glass, films having suitable barrier properties such as alternating stacks of polymer and dielectric as disclosed in, for example, WO 01/81649 or an airtight container as disclosed in, for example, WO 01/19142. A getter material for absorption of any atmospheric moisture and/or oxygen that may permeate through the substrate or encapsulant may be disposed between the substrate and the encapsulant.

In a practical device, at least one of the electrodes is semitransparent in order that light may be absorbed (in the case of a photoresponsive device) or emitted (in the case of an OLED). Where the anode is transparent, it typically comprises indium tin oxide. Examples of transparent cathodes are disclosed in, for example, GB 2348316.

The embodiment of FIG. 1 illustrates a device wherein the device is formed by firstly forming an anode on a substrate followed by deposition of an electroluminescent layer and a cathode. However it will be appreciated that the device of the invention could also be formed by firstly forming a cathode on a substrate followed by deposition of an electroluminescent layer and an anode.

Various polymers are useful as emitters and/or charge transporters. Some examples of these are given below. The repeat units discussed below may be provided in a homopolymer, in a blend of polymers and/or in copolymers. It is envisaged that conductive polymer compositions according to embodiments of the present invention may be used with any such combination. In particular, conductive polymer layers of the present invention may be tuned in relation to the particular emissive and charge transport layers utilized in a device in order to obtain a desired conductivity, HOMO and LUMO.

Polymers may comprise a first repeat unit selected from arylene repeat units, in particular: 1,4-phenylene repeat units as disclosed in J. Appl. Phys. 1996, 79, 934; fluorene repeat units as disclosed in EP 0842208; indenofluorene repeat units as disclosed in, for example, Macromolecules 2000, 33(6), 2016-2020; and spirofluorene repeat units as disclosed in, for example EP 0707020. Each of these repeat units is optionally substituted. Examples of substituents include solubilising groups such as $C_{1-20}$ alkyl or alkoxy; electron withdrawing groups such as fluorine, nitro or cyano; and substituents for increasing glass transition temperature (Tg) of the polymer.

Particularly preferred polymers comprise optionally substituted, 2,7-linked fluorenes, most preferably repeat units of formula (41).

A polymer comprising the first repeat unit may provide one or more of the functions of hole transport, electron transport and emission depending on which layer of the device it is used in and the nature of co-repeat units.

A homopolymer of the first repeat unit, such as a homopolymer of 9,9-dialkylfluoren-2,7-diyl, may be utilised to provide electron transport.

A copolymer comprising a first repeat unit and a triarylamine repeat unit may be utilised to provide hole transport and/or emission.

Particularly preferred hole transporting polymers of this type are AB copolymers of the first repeat unit and a triarylamine repeat unit.

A copolymer comprising a first repeat unit and heteroaryl repeat unit may be utilised for charge transport or emission. Preferred heteroaryl repeat units are selected from formulae 69-83:

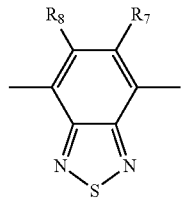

69 wherein $R_7$ and $R_8$ are the same or different and are each independently hydrogen or a substituent group, preferably alkyl, aryl, perfluoroalkyl, thioalkyl, cyano, alkoxy, heteroaryl, alkylaryl or arylalkyl. For ease of manufacture, $R_7$ and $R_8$ are preferably the same. More preferably, they are the same and are each a phenyl group.

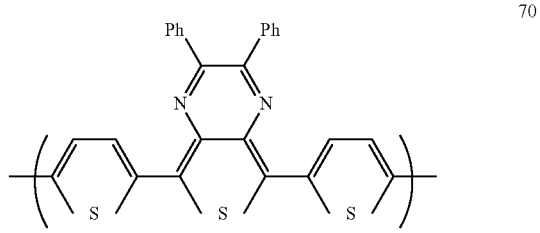

70

71

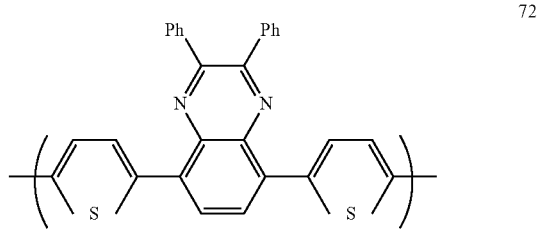

72

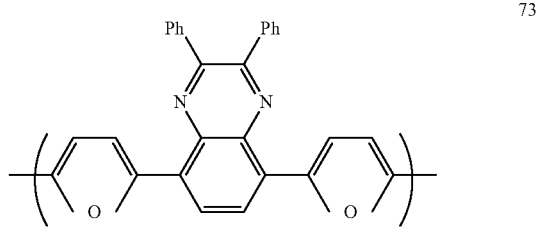

73

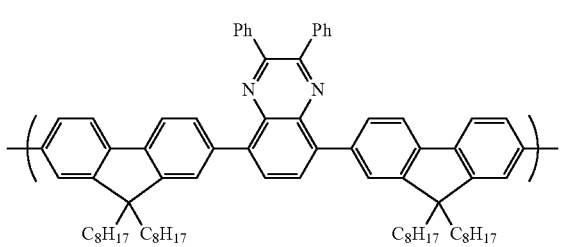

74

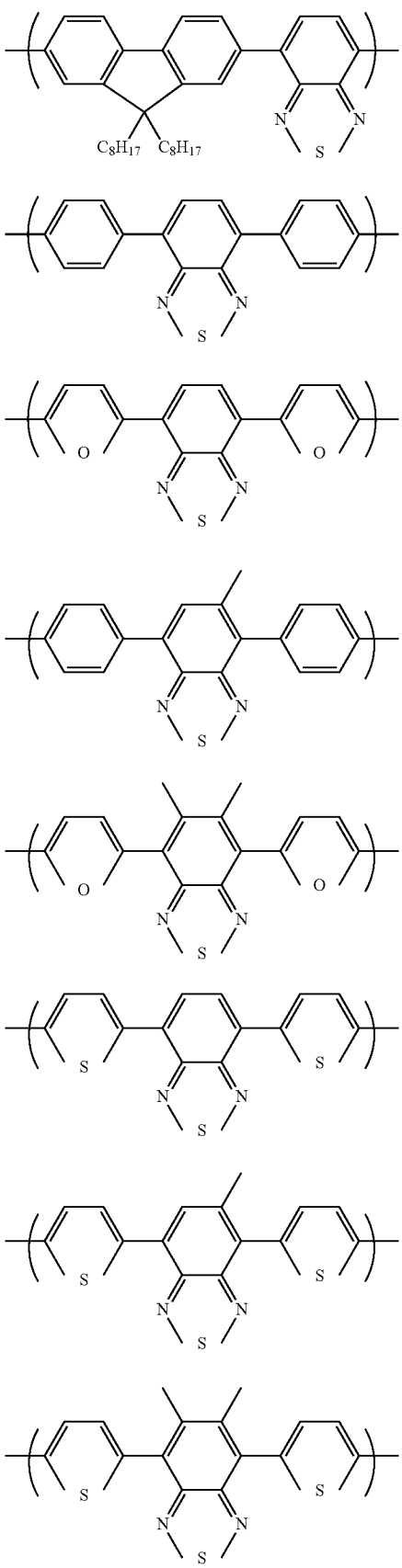

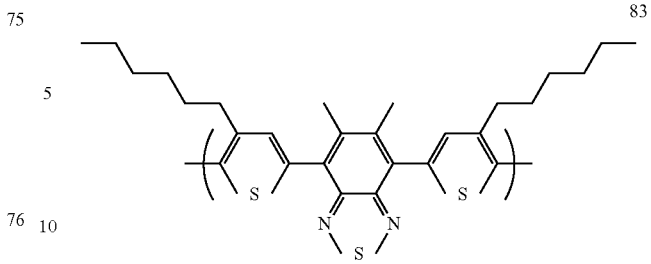

Electroluminescent copolymers may comprise an electroluminescent region and at least one of a hole transporting region and an electron transporting region as disclosed in, for example, WO 00/55927 and U.S. Pat. No. 6,353,083. If only one of a hole transporting region and electron transporting region is provided then the electroluminescent region may also provide the other of hole transport and electron transport functionality.

The different regions within such a polymer may be provided along the polymer backbone, as per U.S. Pat. No. 6,353,083, or as groups pendent from the polymer backbone as per WO 01/62869.

Preferred methods for preparation of these polymers are Suzuki polymerisation as described in, for example, WO 00/53656 and Yamamoto polymerisation as described in, for example, T. Yamamoto, "Electrically Conducting And Thermally Stable n—Conjugated Poly(arylene)s Prepared by Organometallic Processes", Progress in Polymer Science 1993, 17, 1153-1205. These polymerisation techniques both operate via a "metal insertion" wherein the metal atom of a metal complex catalyst is inserted between an aryl group and a leaving group of a monomer. In the case of Yamamoto polymerisation, a nickel complex catalyst is used; in the case of Suzuki polymerisation, a palladium complex catalyst is used.

For example, in the synthesis of a linear polymer by Yamamoto polymerisation, a monomer having two reactive halogen groups is used. Similarly, according to the method of Suzuki polymerisation, at least one reactive group is a boron derivative group such as a boronic acid or boronic ester and the other reactive group is a halogen. Preferred halogens are chlorine, bromine and iodine, most preferably bromine.

It will therefore be appreciated that repeat units and end groups comprising aryl groups as illustrated throughout this application may be derived from a monomer carrying a suitable leaving group.

Suzuki polymerisation may be used to prepare regioregular, block and random copolymers. In particular, homopolymers or random copolymers may be prepared when one reactive group is a halogen and the other reactive group is a boron derivative group. Alternatively, block or regioregular, in particular AB, copolymers may be prepared when both reactive groups of a first monomer are boron and both reactive groups of a second monomer are halogen.

As alternatives to halides, other leaving groups capable of participating in metal insertion include tosylate, mesylate, phenyl sulfonate and triflate.

A single polymer or a plurality of polymers may be deposited from solution. Suitable solvents for polyarylenes, in particular polyfluorenes, include mono- or poly-alkylbenzenes such as toluene and xylene. Particularly preferred solution deposition techniques are spin-coating and inkjet printing.

Spin-coating is particularly suitable for devices wherein patterning of the electroluminescent material is unnecessary—for example for lighting applications or simple monochrome segmented displays.

Inkjet printing is particularly suitable for high information content displays, in particular full colour displays. Inkjet printing of OLEDs is described in, for example, EP 0880303.

If multiple layers of the device are formed by solution processing then the skilled person will be aware of techniques to prevent intermixing of adjacent layers, for example by crosslinking of one layer before deposition of a subsequent layer or selection of materials for adjacent layers such that the material from which the first of these layers is formed is not soluble in the solvent used to deposit the second layer.

Phosphorescent materials are also useful and in some applications may be preferable to fluorescent materials. One type of phosphorescent material comprises a host and a phosphorescent emitter in the host. The emitter may be bonded to the host or provided as a separate component in a blend.

Numerous hosts for phosphorescent emitters are described in the prior art including "small molecule" hosts such as 4,4'-bis(carbazol-9-yl)biphenyl), known as CBP, and (4,4',4"-tris(carbazol-9-yl)triphenylamine), known as TCTA, disclosed in Ikai et al. (*Appl. Phys. Lett.,* 79 no. 2, 2001, 156); and triarylamines such as tris-4-(N-3-methylphenyl-N-phenyl)phenylamine, known as MTDATA. Homopolymers are also known as hosts, in particular poly(vinyl carbazole) disclosed in, for example, Appl. Phys. Lett. 2000, 77(15), 2280; polyfluorenes in Synth. Met. 2001, 116, 379, Phys. Rev. B 2001, 63, 235206 and Appl. Phys. Lett. 2003, 82(7), 1006; poly[4-(N-4-vinylbenzyloxyethyl, N-methylamino)-N-(2,5-di-tert-butylphenylnapthalimide] in Adv. Mater. 1999, 11(4), 285; and poly(para-phenylenes) in J. Mater. Chem. 2003, 13, 50-55.

Preferred phosphorescent metal complexes comprise optionally substituted complexes of formula (84):

wherein M is a metal; each of $L^1$, $L^2$ and $L^3$ is a coordinating group; q is an integer; r and s are each independently 0 or an integer; and the sum of (a. q)+(b. r)+(c.s) is equal to the number of coordination sites available on M, wherein a is the number of coordination sites on $L^1$, b is the number of coordination sites on $L^2$ and c is the number of coordination sites on $L^3$.

Heavy elements M induce strong spin-orbit coupling to allow rapid intersystem crossing and emission from triplet states (phosphorescence). Suitable heavy metals M include:
lanthanide metals such as cerium, samarium, europium, terbium, dysprosium, thulium, erbium and neodymium; and
d-block metals, in particular those in rows 2 and 3 i.e. elements 39 to 48 and 72 to 80, in particular ruthenium, rhodium, palladium, rhenium, osmium, iridium, platinum and gold.

Suitable coordinating groups for the f-block metals include oxygen or nitrogen donor systems such as carboxylic acids, 1,3-diketonates, hydroxy carboxylic acids, Schiff bases including acyl phenols and iminoacyl groups. As is known, luminescent lanthanide metal complexes require sensitizing group(s) which have the triplet excited energy level higher than the first excited state of the metal ion. Emission is from an f-f transition of the metal and so the emission colour is determined by the choice of the metal. The sharp emission is generally narrow, resulting in a pure colour emission useful for display applications.

The d-block metals form organometallic complexes with carbon or nitrogen donors such as porphyrin or bidentate ligands of formula (85):

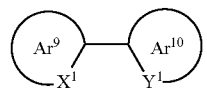

wherein $Ar^9$ and $Ar^{10}$ may be the same or different and are independently selected from optionally substituted aryl or heteroaryl; $X^1$ and $Y^1$ may be the same or different and are independently selected from carbon or nitrogen; and $Ar^9$ and $Ar^{10}$ may be fused together. Ligands wherein $X^1$ is carbon and $Y^1$ is nitrogen are particularly preferred.

Examples of bidentate ligands are illustrated below:

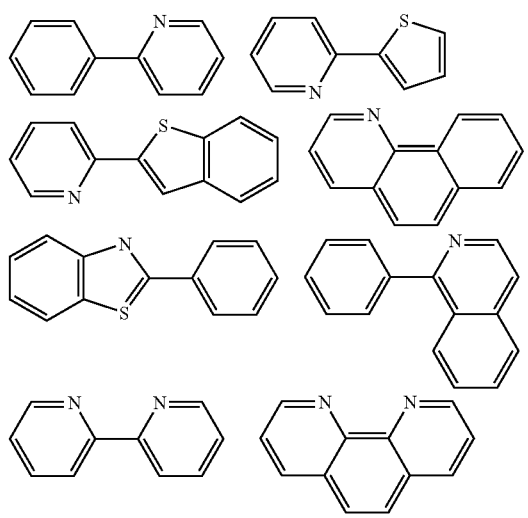

Each of $Ar^9$ and $Ar^{10}$ may carry one or more substituents. Particularly preferred substituents include fluorine or trifluoromethyl which may be used to blue-shift the emission of the complex as disclosed in WO 02/45466, WO 02/44189, US 2002-117662 and US 2002-182441; alkyl or alkoxy groups as disclosed in JP 2002-324679; carbazole which may be used to assist hole transport to the complex when used as an emissive material as disclosed in WO 02/81448; bromine, chlorine or iodine which can serve to functionalise the ligand for attachment of further groups as disclosed in WO 02/68435 and EP 1245659; and dendrons which may be used to obtain or enhance solution processability of the metal complex as disclosed in WO 02/66552.

Other ligands suitable for use with d-block elements include diketonates, in particular acetylacetonate (acac); triarylphosphines and pyridine, each of which may be substituted.

Main group metal complexes show ligand based, or charge transfer emission. For these complexes, the emission colour is determined by the choice of ligand as well as the metal.

The host material and metal complex may be combined in the form of a physical blend. Alternatively, the metal complex may be chemically bound to the host material. In the case of a polymeric host, the metal complex may be chemically bound as a substituent attached to the polymer backbone, incorporated as a repeat unit in the polymer backbone or provided as an end-group of the polymer as disclosed in, for example, EP 1245659, WO 02/31896, WO 03/18653 and WO 03/22908.

Such host-emitter systems are not limited to phosphorescent devices. A wide range of fluorescent low molecular weight metal complexes are known and have been demonstrated in organic light emitting devices [see, e.g., Macromol. Sym. 125 (1997) 1-48, U.S. Pat. No. 5,150,006, U.S. Pat. No. 6,083,634 and U.S. Pat. No. 5,432,014].

A wide range of fluorescent low molecular weight metal complexes may be used with the present invention. A preferred example is tris-(8-hydroxyquinoline)aluminium. Suitable ligands for di or trivalent metals include: oxinoids, e.g. with oxygen-nitrogen or oxygen-oxygen donating atoms, generally a ring nitrogen atom with a substituent oxygen atom, or a substituent nitrogen atom or oxygen atom with a substituent oxygen atom such as 8-hydroxyquinolate and hydroxyquinoxalinol-10-hydroxybenzo (h) quinolinato (II), benzazoles (III), schiff bases, azoindoles, chromone derivatives, 3-hydroxyflavone, and carboxylic acids such as salicylato amino carboxylates and ester carboxylates. Optional substituents include halogen, alkyl, alkoxy, haloalkyl, cyano, amino, amido, sulfonyl, carbonyl, aryl or heteroaryl on the (hetero) aromatic rings which may modify the emission colour.

The invention claimed is:

1. A conductive composition for use in an organic light-emitting device comprising:
   a polycation having a conjugated backbone;
   a polyanion to balance the charge on the polycation; and
   a semiconductive hole transport polymer containing side groups pendant from the polymer backbone, each side group comprising one or more groups XY, where XY represents a group with a high dissociation constant such that it is ionized completely,
   wherein the conductive composition is substantially free of non-ionized polystyrene sulfonic acid, and
   the polyanion is the ionized form of the hole transport polymer.

2. A composition according to claim 1, wherein the polycation comprises an oxidized conductive poly (thiophene).

3. A composition according to claim 2, wherein the polycation comprises oxidized conductive polyethylene dioxythiophene (PEDOT).

4. A composition according to claim 1, wherein the hole transport polymer comprises an aryl or heteroaryl repeat group (Ar).

5. A composition according to claim 4, wherein Ar is selected from the group consisting of fluorene, spirofluorene, indenofluorene, phenylene, phenylenevinylene, thiophene, benzothiadiazole, carbazole, and triarylamine groups.

6. A composition according to claim 4, wherein Ar is present in a side group that is pendant from the polymer backbone.

7. A composition according to claim 6, wherein the hole transport polymer contains a repeat side group comprising formula 1:

(1)

where Ar represents an aryl or heteraryl group and XY represents a group with a high dissociation constant, such that it is ionized completely.

8. A composition according to claim 7, wherein the side group is attached to a non-conjugated region in the polymer backbone.

9. A composition according to claim 8, wherein the hole transport polymer comprises a repeat unit of formula 7:

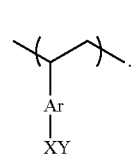

(7)

10. A composition according to claim 4, wherein Ar is present in the polymer backbone.

11. A composition according to claim 10, wherein the hole transport polymer comprises a repeat unit comprising general formula 12:

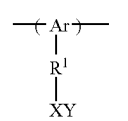

(12)

where $R^1$ represents an optional organic linking group.

12. A composition according to claim 11, wherein $R^1$ comprises a group which breaks the conjugation between XY and Ar.

13. A composition according to claim 11, wherein $R^1$ is selected from the group consisting of aryl; heteroaryl; alkyl; alkoxy; and perfluoroalkyl.

14. A composition according to claim 11, wherein the polymer contains one or more further aryl or heteroaryl repeat unit.

15. A composition according to claim 14, wherein the further repeat unit is a triarylamine repeat unit or a fluorene repeat unit.

16. A composition according to claim 1, wherein the hole transport polymer comprises a linear polymer.

17. An organic light-emitting device comprising:
   an anode;
   a cathode;
   a light-emitting layer located between the anode and the cathode; and
   a hole-injecting layer located between the anode and the light-emitting layer,
   wherein the hole-injecting layer comprises a conductive composition comprising:
   a polycation having a conjugated backbone;
   a polyanion to balance the charge on the polycation; and
   a semiconductive hole transport polymer containing side groups pendant from the polymer backbone, each side group comprising one or more groups XY, where XY represents a group with a high dissociation constant such that it is ionized completely,
   wherein the conductive composition is substantially free of non-ionized polystyrene sulfonic acid, and
   the polyanion is the ionized form of the hole transport polymer.

18. A method of manufacturing an organic light-emitting device comprising:

an anode;

a cathode;

a light-emitting layer located between the anode and the cathode; and a hole-injecting layer located between the anode and the light-emitting layer, wherein the hole-injecting layer comprises a conductive composition, said method including the step of depositing the conductive composition as a layer by spin coating or ink jet printing or roll-printing, said conductive composition comprising a polycation having a conjugated backbone; a polyanion to balance the charge on the polycation; and a semiconductive hole transport polymer containing side groups pendant from the polymer backbone, each side group comprising one or more groups XY, where XY represents a group with a high dissociation constant such that it is ionized completely, wherein the conductive composition is substantially free of non-ionized polystyrene sulfonic acid, and the polyanion is the ionized form of the hole transport polymer.

19. A method of manufacturing an organic light-emitting device comprising:

an anode;

a cathode;

a light-emitting layer located between the anode and the cathode; and a hole-injecting layer located between the anode and the light-emitting layer, wherein the hole-injecting layer comprises a conductive composition comprising:

a polycation having a conjugated backbone;

a polyanion to balance the charge on the polycation; and a semiconductive hole transport polymer containing side groups pendant from the polymer backbone, each side group comprising one or more groups XY, where XY represents a group with a high dissociation constant such that it is ionized completely, wherein the conductive composition is substantially free of non-ionized polystyrene sulfonic acid, and the polyanion is the ionized form of the hole transport polymer, said method including the steps of:

(a) forming the hole-injecting layer by depositing a solution comprising said conductive composition in a first solvent; and (b) forming the light-emitting layer on the hole-injecting layer by depositing a solution comprising a light-emitting material in a second solvent.

* * * * *